US011237210B1

(12) United States Patent
Sanyal et al.

(10) Patent No.: US 11,237,210 B1
(45) Date of Patent: Feb. 1, 2022

(54) LAYOUT-AWARE TEST PATTERN GENERATION AND FAULT DETECTION

(71) Applicant: Synopsys, Inc., Mountain View, CA (US)

(72) Inventors: Alodeep Sanyal, Santa Clara, CA (US); Girish A. Patankar, Cupertino, CA (US); Rohit Kapur, Cupertino, CA (US); Salvatore Talluto, Cavanago di Brianza (IT)

(73) Assignee: Synopsys, Inc., Mountain View, CA (US)

( * ) Notice: Subject to any disclaimer, the term of this patent is extended or adjusted under 35 U.S.C. 154(b) by 274 days.

(21) Appl. No.: 16/285,058

(22) Filed: Feb. 25, 2019

Related U.S. Application Data

(62) Division of application No. 13/561,918, filed on Jul. 30, 2012, now Pat. No. 10,254,343.

(51) Int. Cl.
*G01R 31/00* (2006.01)
*G01R 31/3183* (2006.01)

(52) U.S. Cl.
CPC .......................... *G01R 31/318371* (2013.01)

(58) Field of Classification Search
CPC ............ G01R 31/318371; G01R 31/00; G01R 31/3181; G01R 31/3183
See application file for complete search history.

(56) References Cited

U.S. PATENT DOCUMENTS

| 2004/0194043 | A1* | 9/2004 | Sundar | G06F 30/367 716/113 |
| 2005/0240887 | A1* | 10/2005 | Rajski | G06F 11/263 716/102 |
| 2006/0156095 | A1 | 7/2006 | Yoshida et al. | |
| 2009/0240458 | A1* | 9/2009 | Desineni | G01R 31/31835 702/120 |
| 2012/0089872 | A1* | 4/2012 | Bartenstein | G06F 11/2205 714/33 |

* cited by examiner

*Primary Examiner* — Regis J Betsch
*Assistant Examiner* — Jeremy A Delozier
(74) *Attorney, Agent, or Firm* — Park, Vaughan, Fleming & Dowler LLP; Laxman Sahasrabuddhe

(57) ABSTRACT

Methods and apparatuses to assign faults to nets in an integrated circuit (IC) are described. Each net comprises a drive pin, a set of load pins, and a fan-out structure that electrically couples the drive pin to the set of load pins. During operation, a fan-out structure of a net can be partitioned into a set of non-overlapping subnets and a set of branch nodes, wherein each branch node electrically couples three or more non-overlapping subnets. Next, each branch node can be represented by using a subnet primitive, wherein each subnet primitive comprises three or more pins that are electrically coupled to non-overlapping subnets that are electrically coupled by the branch node. A fault can then be assigned to a pin of a subnet primitive that is electrically coupled to a non-overlapping subnet, thereby modeling the fault in the non-overlapping subnet.

15 Claims, 7 Drawing Sheets

LAYOUT-AWARE TEST PATTERN GENERATION AND FAULT DETECTION

RELATED APPLICATION

This patent application is a divisional of pending U.S. patent application Ser. No. 13/561,918, entitled "Layout-Aware Test Pattern Generation and Fault Detection," by inventors Alodeep Sanyal, Girish A. Patankar, Rohit Kapur and Salvatore Talluto, filed on 30 Jul. 2012, the contents of which are herein incorporated by reference in their entirety for all purposes.

BACKGROUND

Technical Field

The present invention relates to techniques for testing semiconductor chips. More specifically, the present invention relates to methods and apparatuses for generating test patterns for detecting faults in semiconductor chips.

Related Art

Advances in semiconductor technology presently make it possible to integrate large-scale systems, including hundreds of millions of transistors, onto a single semiconductor chip. This dramatic increase in semiconductor integration densities has made it considerably more challenging to efficiently test semiconductor devices after device manufacturing. Defects (systematic and random) introduced during manufacturing process may cause a signal line to get broken or shorted with another line resulting in the manufactured chip to fail. Moreover, a semiconductor chip may meet timing constraints during the design phase, however, a manufactured semiconductor chip may contain defects, due to process variations and other factors, which may result in a delay violation causing the chip to fail. These defects can be modeled as faults (such as stuck-at, transition, path-delay, bridging, etc.) and be detected by generating appropriate test patterns.

Automatic test pattern generation (ATPG) techniques obtain their efficiency by covering a large set of easy-to-detect faults first, and then targeting individual hard-to-detect faults. Usually, a pattern generated to detect a single fault ends up fortuitously detecting many other faults. Test pattern generation algorithms leverage this notion of fortuitous detection by performing fault simulation on every pattern generated to eliminate the faults fortuitously detected by the given pattern from the fault list.

Conventional automatic test pattern generation (ATPG) engines/techniques typically assume all faults are equally likely to occur and therefore assign equal weight to each fault during test pattern generation. Consequently, every single fault is equally important from testing point of view. Note that it is impractical to cover all possible faults on millions of sites within a reasonable amount of time. As a result, faults that are harder to test are not sufficiently covered by the conventional techniques. Note that such techniques have been fairly effective when the escape rate, or the defective parts per million (DPPM) level is high. However, as acceptable DPPM levels continue to decrease and IC manufacturers aggressively pursue an objective of near zero DPPM, the conventional ATPG techniques have become increasingly ineffective.

Another potential problem associated with conventional ATPG techniques lies in the fact that high fault coverage usually does not guarantee high defect coverage. This is because when an ATPG technique assumes all faults are equally likely to occur, the easy-to-occur but hard-to-detect faults (i.e., the high risk faults) become less likely to be detected than the easy-to-detect faults. As a result, the high risk faults are often not treated effectively with the current techniques. For example, when an ATPG technique achieves 98% fault coverage, the remaining 2% of the uncovered faults can represent significantly more than 2% of the risk of defects.

Hence, what is needed is a method and an apparatus for generating test patterns for more effective fault coverage in detecting defects in semiconductor chips without the problems described above.

SUMMARY

Some embodiments described herein provide techniques and systems to generate test patterns for detecting faults in an integrated circuit (IC). During operation, the system receives a layout for the IC. The system then generates a set of faults to model a set of defects associated with the layout. Next, the system determines the likelihood of occurrence for each fault based on a portion of the layout associated with each fault in the set of faults. The system subsequently generates a set of test patterns to target the set of faults, wherein the individual faults are targeted based on their likelihood occurrence.

In some embodiments, the system determines the set of likelihoods of occurrence for the set of faults by first determining an area of the portion of the layout associated with each fault in the set of faults. The system then computes the set of likelihoods of occurrence for the set of faults such that a fault which is associated with a greater area obtains a greater likelihood of occurrence.

In some embodiments, a computed likelihood of occurrence for a fault in the set of faults is proportional to the area of the portion of the layout associated with the fault.

In some embodiments, the area of the portion of the layout associated with the fault includes a routing area within the portion of the layout.

In some embodiments, the system generates the set of test patterns by first assigning a set of weights to the set of faults such that a fault in the set of faults which is associated with a greater likelihood of occurrence receives a higher weight. Next, the system ranks the set of weights associated with the set of faults. The system then generates the set of test patterns such that a first fault in the set of faults associated with a higher weight is targeted by a test pattern prior to targeting a second fault in the set of faults associated with a lower weight.

In some embodiments, the system assigns a greater number of test patterns to target a first subset of faults in the set of faults associated with higher weights, while assigning a smaller number of test patterns to target a second subset of faults in the set of faults associated with lower weights.

In some embodiments, the system first generates a set of random test patterns considering equal weight for each fault to cover a set of easy-to-detect faults. The system then generates a set of deterministic test patterns to specifically cover a set of hard-to-detect faults.

In some embodiments, the system uses an automatic test pattern generation (ATPG) engine to generate the set of test patterns.

In some embodiments, the system identifies a net in the layout, wherein the net comprises a drive pin, a set of load pins, and a fan-out structure coupled between the drive pin and the set of load pins. Next, the system partitions the fan-out structure into a set of subnets, where each subnet in the set of subnets does not overlap with other subnets in the set of subnets. The system then places a primitive (referred to as "subnet primitive" or "fan-out primitive") in place of each subnet such that each of the subnet primitives is attached to one subnet at an input pin of the subnet primitive and two or more subnets at two or more output pins of the subnet primitive. The subnet primitive models a fan-out branch structure such that the input to the structure becomes the input to the subnet primitive and the individual output of the structure becomes an output of the subnet primitive. The system next assigns a fault to a subnet in the set of subnets, wherein the fault is assigned to either an input pin or an output pin of a subnet primitive attached to the subnet.

In some embodiments, a subnet primitive can be viewed as a logic gate having one input and two outputs.

In some embodiments, prior to assigning the fault to the subnet, the system assigns a set of weights to the set of subnets.

In some embodiments, the system assigns a higher weight to a subnet which is associated with a greater routing area, while assigning a lower weight to a subnet which is associated with a smaller routing area.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Integrated Circuit Design Flow

Figure 1:
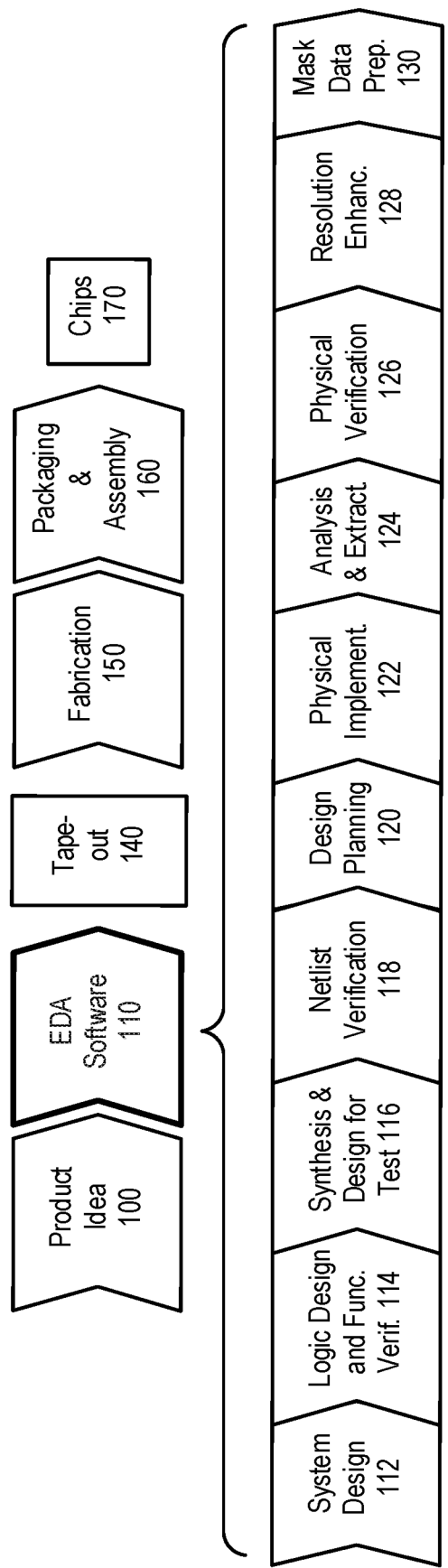
FIG. 1 illustrates various steps in the design and fabrication of an integrated circuit.

FIG. 1 illustrates various steps in the design and fabrication of an integrated circuit. The process starts with the generation of a product idea (stage 100), which is realized using an Electronic Design Automation (EDA) software design process (stage 110). When the design is finalized, it can be taped-out (stage 140). After tape-out, the fabrication process is consummated (stage 150) and packaging and assembly processes (stage 160) are performed which ultimately result in finished chips (stage 170).

The EDA software design process (stage 110), in turn, comprises stages 112-130, which are described below. Note that this design flow description is for illustration purposes only. This description is not meant to limit the present invention. For example, an actual integrated circuit design may require a designer to perform the design stages in a different sequence than the sequence described herein. The following discussion provides further details of the stages in the design process.

System design (stage 112): The designers describe the functionality to implement. They can also perform what-if planning to refine the functionality and to check costs. Hardware-software architecture partitioning can occur at this stage. Exemplary EDA software products from SYNOPSYS, INC. that can be used at this stage include MODEL ARCHITECT®, SABER®, SYSTEM STUDIO®, and DESIGNWARE® products.

Logic design and functional verification (stage 114): At this stage, the VHDL or Verilog code for modules in the system is written and the design is checked for functional accuracy. More specifically, the design is checked to ensure that it produces the correct outputs. Exemplary EDA software products from SYNOPSYS, INC. that can be used at this stage include VCS®, VERA®, DESIGNWARE®, MAGELLAN®, FORMALITY®, ESP® and LEDA® products.

Synthesis and design (stage 116): Here, the VHDL/Verilog is translated to a netlist. The netlist can be optimized for the target technology. Additionally, tests can be designed and implemented to check the finished chips. Exemplary EDA software products from SYNOPSYS, INC. that can be used at this stage include DESIGN COMPILER®, PHYSICAL COMPILER®, TEST COMPILER®, POWER COMPILER®, FPGA COMPILER®, TETRAMAX®, and DESIGNWARE® products.

Netlist verification (stage 118): At this stage, the netlist is checked for compliance with timing constraints and for correspondence with the VHDL/Verilog source code. Exemplary EDA software products from SYNOPSYS, INC. that can be used at this stage include FORMALITY®, PRIMETIME®, and VCS® products.

Design planning (stage 120): Here, an overall floor plan for the chip is constructed and analyzed for timing and top-level routing. Exemplary EDA software products from SYNOPSYS, INC. that can be used at this stage include ASTRO® and IC COMPILER® products.

Physical implementation (stage 122): The placement (positioning of circuit elements) and routing (connection of the same) occurs at this stage. Exemplary EDA software products from SYNOPSYS, INC. that can be used at this stage include the ASTRO® and IC COMPILER® products.

Analysis and extraction (stage 124): At this stage, the circuit function is verified at a transistor level; this, in turn, permits what-if refinement. Exemplary EDA software products from SYNOPSYS, INC. that can be used at this stage include ASTRORAIL®, PRIMERAIL®, PRIMETIME®, HSPICE®, HSIM®, NANOTIME®, NANOSIM® and STAR-RCXT® products.

Physical verification (stage 126): In this stage, the design is checked to ensure correctness for manufacturing, electrical issues, lithographic issues, and circuitry. Exemplary EDA software products from SYNOPSYS, INC. that can be used at this stage include the HERCULES® product.

Resolution enhancement (stage 128): This stage involves geometric manipulations of the layout to improve manufacturability of the design. Exemplary EDA software products from SYNOPSYS, INC. that can be used at this stage include PROTEUS®, PROTEUS®AF, and PSMGED® products.

Mask data preparation (stage 130): This stage provides the tape-out data for production of masks to produce finished chips. Exemplary EDA software products from SYNOPSYS, INC. that can be used at this stage include the CATS® family of products.

Embodiments of the present invention can be used during one or more of the above-described steps.

Overview

Some embodiments of the present disclosure provide a technique for improving an ATPG process such that the test patterns are generated more effectively in detecting actual defects. In these embodiments, prior to generating test patterns targeting the existing faults, weights are assigned to the faults based on the likelihood of occurrence of each of the faults. In particular, the likelihood of occurrence can be computed based on the layout information. Note that this weight assignment process provides a metric on assessing quality of test patterns for fault coverage. Using this metric, an ATPG engine can generate tests to target high weight, high likelihood faults earlier and/or with more computational resources than those low weight, low likelihood faults, thereby generating better quality test patterns. By generating better quality test patterns, the present technique improves ATPG effectiveness with a given set of test patterns. This improvement of test effectiveness also leads to a faster automatic test equipment (ATE) turn-around time.

Some embodiments of this disclosure also introduce an ATPG primitive referred to as a "subnet-primitive" or "fan-out primitive" that allows an ATPG engine to target a fault at a fan-out branch of a net, rather than on pins (as in the conventional techniques). Using this primitive, weights can be assigned to faults associated with specific fan-out branches within the same net. In some embodiments, the weights can be computed based on the layout areas associated with the specific fan-out branches. The ATPG engine can then generate tests that target faults with high risk based on the weights on certain fan-out branches.

Although some embodiments of the present techniques are described in the scope of ATPG engines, the present techniques are not meant to be limited to ATPG engines. In general, the present techniques can be used with any type of test pattern generation engine to improve the effectiveness of test pattern generation and the quality of the generated test patterns.

Layout-Aware Test Pattern Generation

Figure 2:
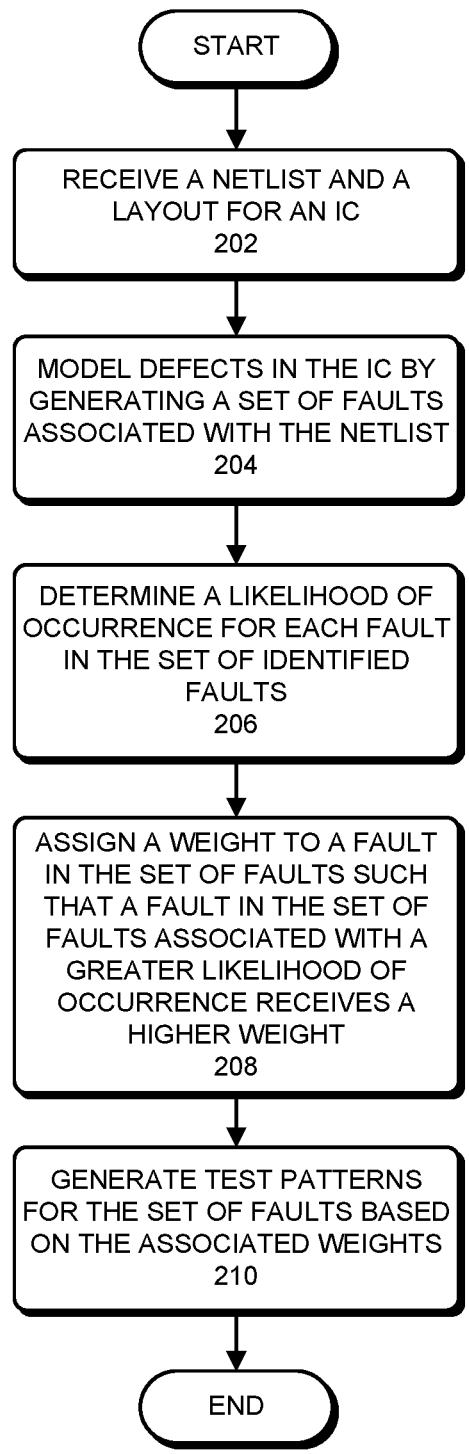
FIG. 2 presents a flowchart illustrating a process of generating test patterns to target faults in accordance with some embodiments described herein.

FIG. 2 presents a flowchart illustrating a process of generating test patterns to target faults in accordance with some embodiments described herein.

The process may begin by receiving a netlist and a layout for an integrated circuit (IC) (step 202). The system then models defects in the IC by generating a set of faults associated with the netlist (step 204). Note that the set of faults can include stuck-at faults, transition faults, path-delay faults, bridging faults, and other types of faults. In particular, each identified fault is typically associated with a specific site within the IC.

Next, the system determines a likelihood of occurrence for each fault in the set of identified faults (step 206). Note that the likelihood of occurrence of a fault can also be viewed as risk of the defect in the IC being modeled by the fault. Hence, a high likelihood of occurrence of a given fault represents a high risk of the modeled defect. In one embodiment, the system can compute the likelihood of occurrence based on a portion of the layout associated with the defect which is being modeled by the fault.

More specifically, the system can first compute an area of a portion of the layout associated with the fault, and then determine the likelihood of occurrence based on the area associated with the portion of the layout. Note that the area of the portion of the layout can include one or more of: a routing area within the portion of the layout, a device area, and a space between layout features. In one embodiment, the computed area is the routing area within the portion of the layout uniquely covered by a pin and/or a subnet associated with the fault. Once the area is determined, the likelihood of occurrence may be computed to be proportional to the area associated with the fault. This is based on the fact that faults uniquely covering higher routing areas generally have higher likelihoods of occurrence. Note that this embodiment based on the routing area may be more effective when it is applied to stuck-at faults.

In another embodiment, the system can alternatively compute a length of the portion of the layout associated with the fault, and then determine the likelihood of occurrence based on the computed length. For example, the computed likelihood of occurrence may be directly proportional to the length of the routing wires associated with the fault, such that a fault which is associated with a greater length receives a greater likelihood of occurrence. Note that this embodiment may be more effective when it is applied to assigning weights to transition faults. However, using the layout information to compute the likelihood of occurrence of a fault should not be limited to area, or to length of a portion of the layout. Other properties of the layout can also be used in determining the likelihood of occurrence of a fault.

After determining a set of likelihoods of occurrence for a set of faults, the system then assigns a weight to each fault in the set of faults such that a fault in the set of faults which is associated with a greater likelihood of occurrence receives a higher weight (step 208). In one embodiment, the weight for a fault is computed as the associated likelihood of occurrence normalized to a common normalization factor, so that the weight value is between 0 and 1. In a particular embodiment, the weight for a given fault equals the computed likelihood of occurrence of the fault.

Next, the system generates test patterns for the set of faults based on the associated weights (step 210). Note that the system can use any test pattern generation technique to generate the test patterns. In one embodiment, generating the test patterns based on the weights involves assigning testing orders to the set of faults based on the weights. In particular, faults associated with higher weights can be assigned with higher testing orders than faults associated with lower weights. For example, prior to generating the test patterns, the system can rank the set of faults based on the associated weights. Assuming there is an upper limit in the number of test patterns that can be generated, the system then generates test patterns to cover a subset of faults in the set of faults which are associated with the highest weights. As a result, the remaining faults in the set of faults which are not covered by the test patterns are those faults associated with the lowest weights and lowest risks.

In another embodiment, generating the test patterns based on the weights involves assigning testing resources to the set of faults based on the associated weights. In particular, faults associated with higher weights can be assigned with a greater amount of testing resources than other faults associated with lower weights. For example, prior to generating the test patterns, the system can rank the set of faults based on the associated weights. The system then assigns a larger number of test patterns per fault to target a first subset of faults in the set of faults associated with higher weights, while assigning a smaller number of test patterns per fault to target a second subset of faults in the set of faults associated with lower weights (assuming there is an upper limit in the number of test patterns that can be generated).

Note that when generating the test patterns based on the weights of the faults, the system can assign both higher testing orders and a greater number of test patterns to those faults associated with higher weights. As a result, the high risk faults can be targeted and tested more aggressively than the low risk faults.

While one particular test pattern typically targets one fault, a given test pattern may be able to target multiple faults. In one embodiment, for each generated test pattern, a cumulative weight can be computed based on how many faults the test pattern can actually detect, wherein the cumulative weight may be computed as the sum of all the weights associated with all the faults that are detected by the test pattern. Based on the cumulative weight associated with the set of detected faults by a given test pattern, a set of such test patterns may be ordered in such a way that the test pattern with the highest cumulative weight is ranked first.

Figure 3:
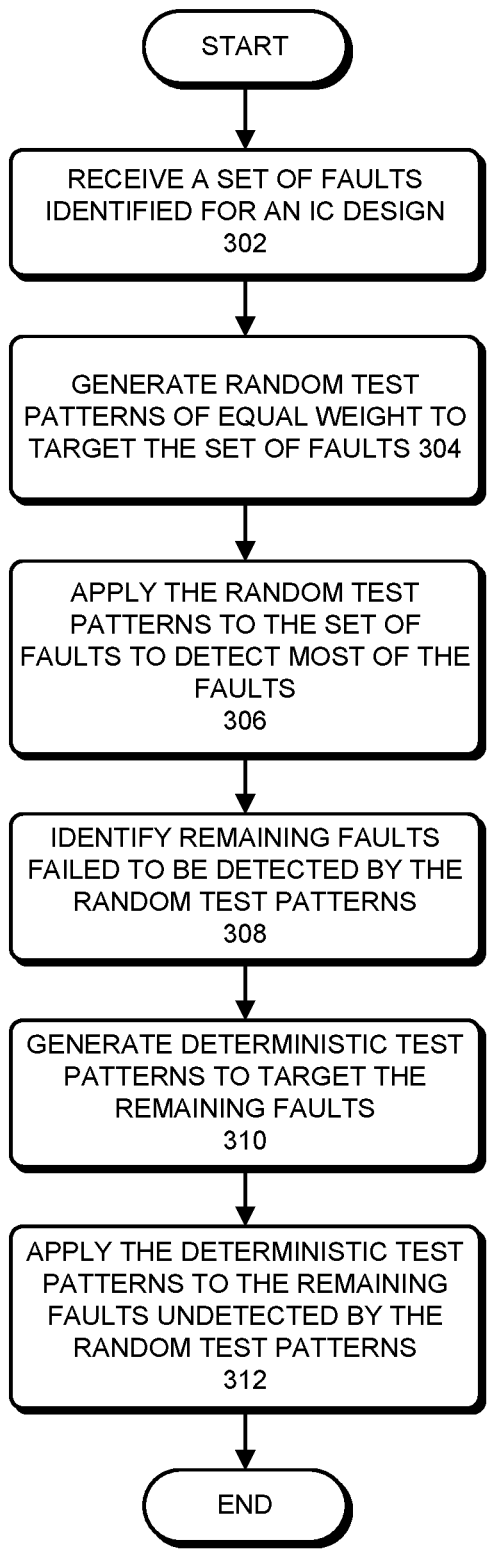
FIG. 3 presents a flowchart illustrating a process of combining random test patterns and deterministic test patterns to target faults in accordance with some embodiments described herein.

As mentioned previously, random test patterns provide equal weight to the entire design space, so they usually cover most of the easier-to-detect faults, but can miss some or most of the harder-to-find faults. For example, some random test patterns can cover about 75% of the faults, but fail to find the remaining 25% of the faults. In contrast, weighted test patterns provide more effective coverage for harder-to-detect faults but require additional overhead for generating the weights, which may not increase the effectiveness in targeting majorities of the easier-to-detect faults. In one embodiment, the proposed weighted test pattern generation technique may be combined with a random test pattern generation technique to target a set of identified faults within an IC design. FIG. 3 presents a flowchart illustrating a process of combining random test patterns and deterministic test patterns to target faults in accordance with some embodiments described herein.

During operation, the system receives a set of faults identified for an IC design (step 302). The system then generates random test patterns of equal weight to target the set of faults (step 304). Note that the random test patterns may be generated using a conventional ATPG technique or any other test generation technique. Next, the system applies the random test patterns to the set of faults to detect most of the faults (step 306). The system subsequently identifies remaining faults in the set of faults undetected by the random test patterns (step 308). The system then generates deterministic test patterns to target the remaining faults (step 310). Note that the deterministic test patterns may be generated using the technique described in conjunction with FIG. 2. Next, the system applies the deterministic test patterns to the remaining faults not covered by the random test patterns (step 312).

Assigning Faults within Fan-Out Branches

Figure 4A:
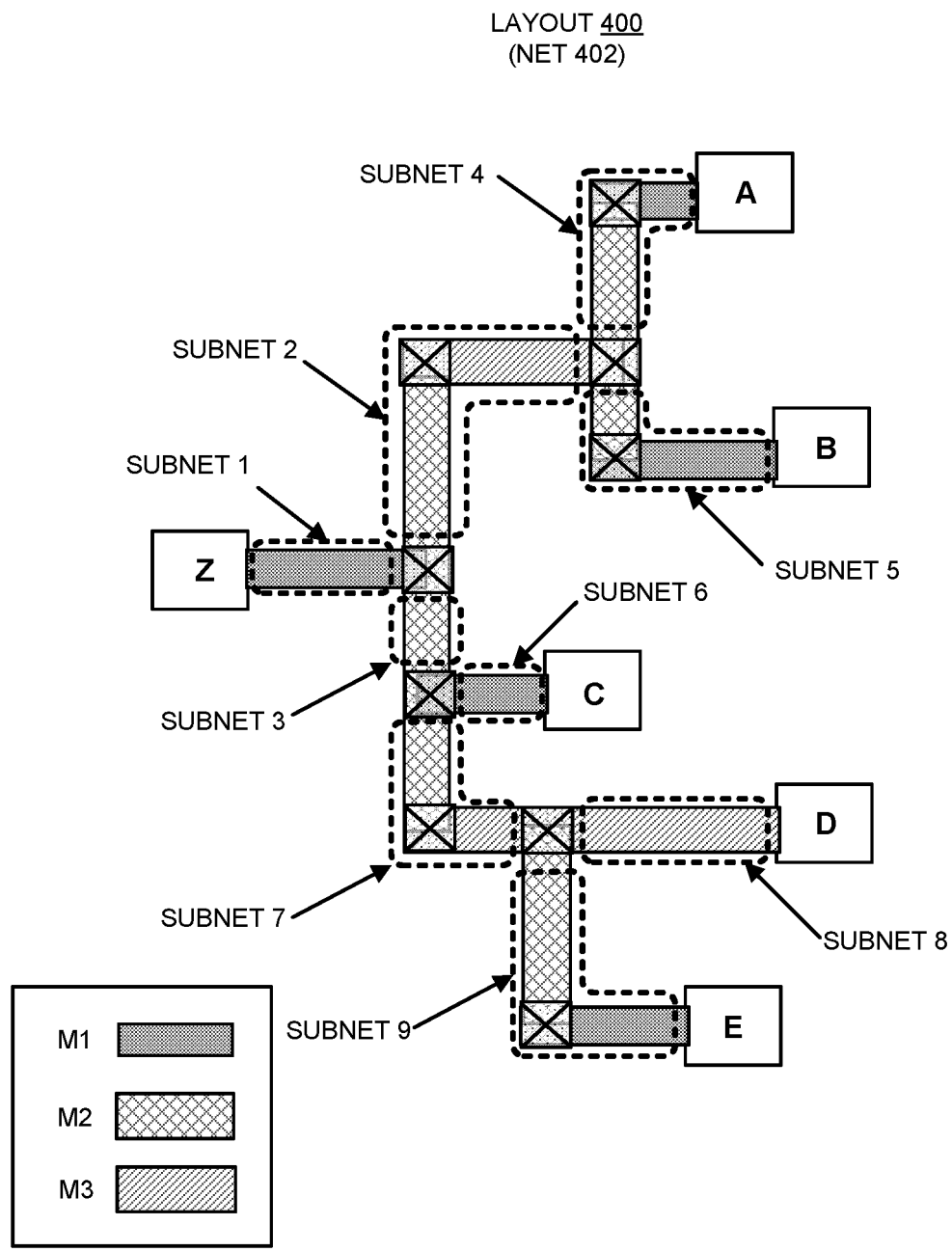
FIG. 4A illustrates an exemplary layout which includes a drive pin coupled to a set of fan-out branches in accordance with some embodiments described herein.

FIG. 4A illustrates an exemplary layout 400 which includes a drive pin Z coupled to a set of fan-out branches in accordance with some embodiments described herein. In one embodiment, the drive pin Z in FIG. 4A is the output of an AND gate (not shown). However drive pin Z can also be the output of other types of logic gate. As is illustrated in FIG. 4A, the set of fan-out branches in layout 400 comprises a set of routing wires distributed within three metal layers (M1, M2, and M3) and interconnected through vias. The set of fan-out branches are also attached to five load pins A-E. In one embodiment, each of the five load pins is the input to a different logic gate. Note that drive pin Z, the set of fan-out branches and the set of load pins A-E form a single net 402.

Note that when a conventional ATPG technique is used on a net, one can only assign faults at pins, not within fan-out branches. For example, to detect a stuck-at fault within net 402, a conventional ATPG technique might assign faults at one of the load pins A-E. However, detecting a fault at a load pin usually does not allow the ATPG technique to pinpoint the actual location of the defect within a fan-out branch between drive pin Z and the targeted load pin, particularly when the associated net has a complex structure. In fact, in order to detect a defect located within a fan-out branch, a conventional ATPG technique has to assign faults to all the affected load pins. For example, if a defect is located within a portion of the layout labeled subnet 2, a conventional ATPG technique has to assign faults to both pin A and pin B in order to detect this fault, because they can both be affected by subnet 2.

One embodiment of this disclosure provides a system which allows an ATPG engine to assign faults within fan-out branches. As can be seen in FIG. 4A, the system first partitions a given net into a set of non-overlapping subnets, such that each subnet covers a unique partition of the net. More specifically, net 402 may be partitioned into 9 subnets, i.e., subnet 1 to subnet 9 as shown. However, net 402 may be partitioned differently than the one shown in FIG. 4A. For example, net 402 can be partitioned into a different number of subnets. In one embodiment, a given partition of a net creates a set of non-overlapping subnets. Note also that subnet 1 in FIG. 4A is attached to the drive pin Z, subnets 4-6 and 8-9 are attached to a respective load pin A-E, while subnets 2-3 and 7 are not attached to either a drive pin or a load pin. In one embodiment, partitioning a net requires that each subnet be attached to no more than one drive pin or load pin.

In one embodiment, after partitioning a net into a set of non-overlapping subnets, the system assigns a weight to each of the subnets. In particular, the weight of a given subnet may be computed based on the total routing area of the subnet. More specifically, the routing area of a subnet may be computed as the area of the metal segments within the subnet plus the area of the pin attached to the subnet (if any). For example, the area of subnet 1 may include both the area of drive pin Z and the area of a metal segment of the M1 layer. The area of subnet 2 may include the area of a first metal segment of the M2 layer and a second metal segment of the M3 layer. The area of subnet 5 may include the area of a first metal segment of the M2 layer and a second metal segment of the M1 layer, as well as the area of load pin B.

In one embodiment, the weights of the subnets are to be normalized to a common value so that the weights of subnets from different nets within a layout may be compared. For example, the system can first compute a total routing area of a given net $N_i$:

$$A(N_i)=\Sigma_j a_j,$$

wherein $a_j$ is the area associated with a subnet j within a partitioned net $N_i$. Next, the system can identify a maximum area $A_{max}$ among all the computed areas of nets within a layout, wherein:

$$A_{max}=\max_i A(N_i).$$

Using $A_{max}$ as the normalizing factor, the system then assigns weights to a given stuck-at fault $f_k$ associated with a subnet k within a given net $N_i$:

$$W(f_k)=A_{fk}/A_{max},$$

wherein $A_{fk}$ is computed from the area of metal segments and pin (if any) uniquely associated with subnet k.

Figure 4B:
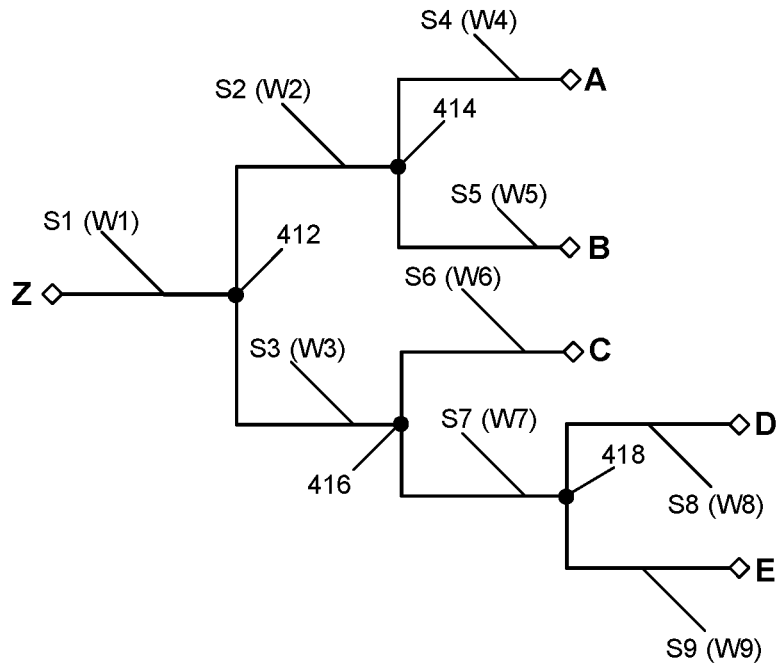
FIG. 4B presents a schematic representation of the net in FIG. 4A which illustrates the interconnections among the set of subnets in accordance with some embodiments described herein.

FIG. 4B presents a schematic representation 410 of net 402 which illustrates the interconnections among the set of subnets 1-9 in accordance with some embodiments described herein. Specifically, subnet 1 (i.e., S1) which is attached to drive pin Z splits into subnet 2 (i.e., S2) and subnet 3 (i.e., S3) at a node 412. Subnet 2 further splits into subnet 4 (i.e., S4) and subnet 5 (i.e., S5) at a node 414, which is attached to load pins A and B respectively. Subnet 3 further splits into subnet 6 (i.e., S6) and subnet 7 (i.e., S7) at a node 416, wherein subnet 6 is attached to load pin C. Subnet 7 again splits into subnet 8 (i.e., S8) and subnet 9 (i.e., S9) at a node 418, which is attached to the remaining two load pins D and E respectively. Note that each of the set of internal nodes within schematic representation 410 is coupled between one input subnet and two output subnets (input/output defined by the direction of current flow). Furthermore, each of the subnets is also associated with a weight ($W_i$, i=1, . . . , 9) computed using the above-described weight generation technique.

Figure 4C:
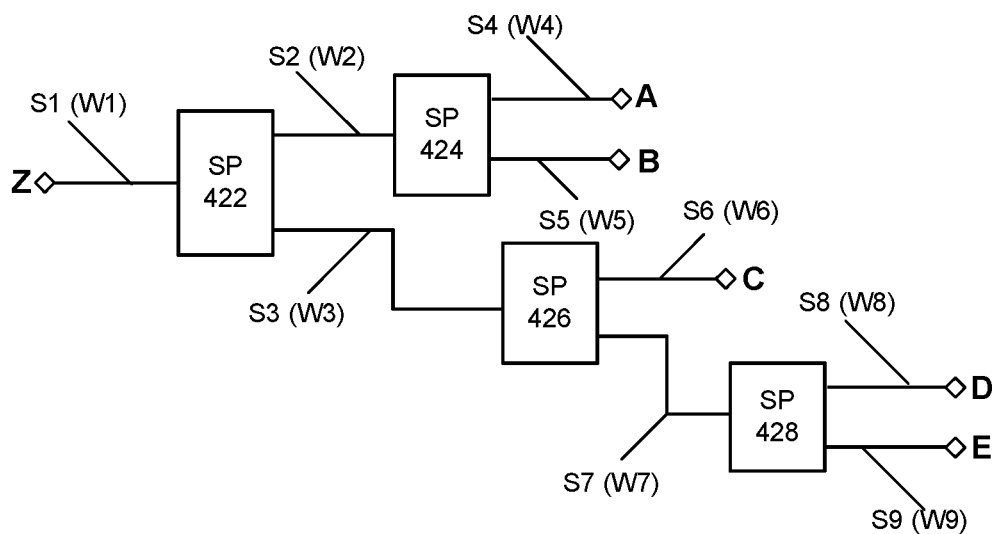
FIG. 4C illustrates a schematic representation of the net in FIG. 4A which uses "fan-out primitives" or "subnet primitives" to separate the set of subnets within the net in accordance with some embodiments described herein.

In some embodiments, a "subnet primitive" or "fan-out primitive" (wherein the two terms are used interchangeably hereinafter) is used to model a fan-out branch structure such that the input to the structure becomes the input to the subnet primitive and the individual output of the structure becomes an output of the subnet primitive. FIG. 4C presents a schematic representation 420 of net 402 which uses a set of subnet primitives to separate the set of subnets within net 402 in accordance with some embodiments described herein. Specifically, a first subnet primitive (SP) 422 takes the place of node 412 in FIG. 4B, a second SP 424 takes the place of node 414, a third SP 426 takes the place of node 416, and a fourth SP 428 takes the place of node 418. Note that each of the subnet primitives comprises one input pin attached to an input subnet and two output pins attached to two output subnets. For example, SP 422 is attached to subnet 1 at the associated input pin and subnets 2 and 3 at the associated output pins. Separately, SP 426 is attached to subnet 3 at the associated input pin and subnets 6 and 7 at the associated output pins. As a result, each subnet primitive illustrated in schematic representation 420 may be treated like a logic gate by an ATPG engine, and faults can then be injected at each of the subnets 1-9 which is not possible conventionally. For example, in schematic representation 420, a stuck-at fault may be injected directly at subnet 2 (S2) before SP 424, and a test pattern may be generated to target this fault. In comparison, conventional techniques have to assign two stuck-at faults at pin A and pin B to detect the same fault at subnet 2 (S2).

Note that while FIG. 4C illustrates each subnet primitive as having one input and two outputs, other embodiments may use subnet primitives having more than two output pins. For example, a variation to schematic representation 420 can integrate SP 426 and SP 428 into a single subnet primitive which is equipped with a single input pin attached to S3 and three output pins attached to S6, S8, and S9.

Note also that each of the faults that can be assigned to a subnet can be ranked based on the computed weight of the subnet and the ATPG engine can prioritize the test pattern generation based on these weights. For example, subnet 2 (S2) may have a higher weight than subnet 3 (S3) due to a greater routing area occupied by S2. As a result, a stuck-at fault at S2 is more likely to be targeted by a test pattern than a stuck-at fault at S3.

Figure 5:
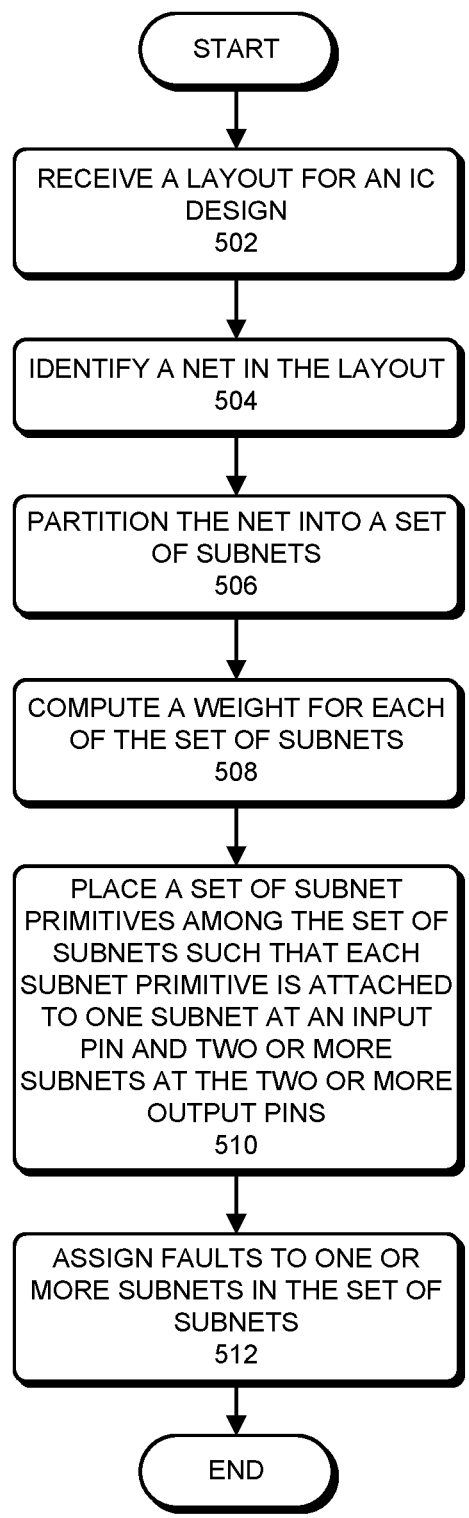
FIG. 5 presents a flowchart illustrating a process of assigning faults within a net in accordance with some embodiments described herein.

FIG. 5 presents a flowchart illustrating a process of assigning faults within a net in accordance with some embodiments described herein. During operation, the system receives a layout for an IC design (step 502). The system identifies a net in the layout (step 504). In one embodiment, the identified net comprises a fan-out structure. The system then partitions the net into a set of subnets (step 506). In one embodiment, the system partitions the net at places where a single branch splits into two or more branches. Moreover, each of the subnets is unique and does not overlap with other subnets. In one embodiment, each subnet in the set of subnets is attached to at most one load pin or drive pin, and some subnets may not be attached to any pin.

Next, the system computes a weight for each of the set of subnets (step 508). For example, the weight may be proportional to the routing area associated with the subnet and the area of a pin attached to the subnet. In one embodiment, the computed weight is normalized so that the weight value is between 0 and 1.

The system subsequently places a set of subnet primitives among the set of subnets such that each subnet primitive is attached to one subnet at an input pin and two or more subnets at the two or more output pins (step 510). Next, the system assigns faults to one or more subnets in the set of subnets (step 512). In one embodiment, the system assigns a fault to a subnet at a pin of a subnet primitive that is attached to the subnet. Subsequently, the system can generate test patterns to target the faults assigned to the subnets based on the associated weights using an ATPG engine.

Figure 6:
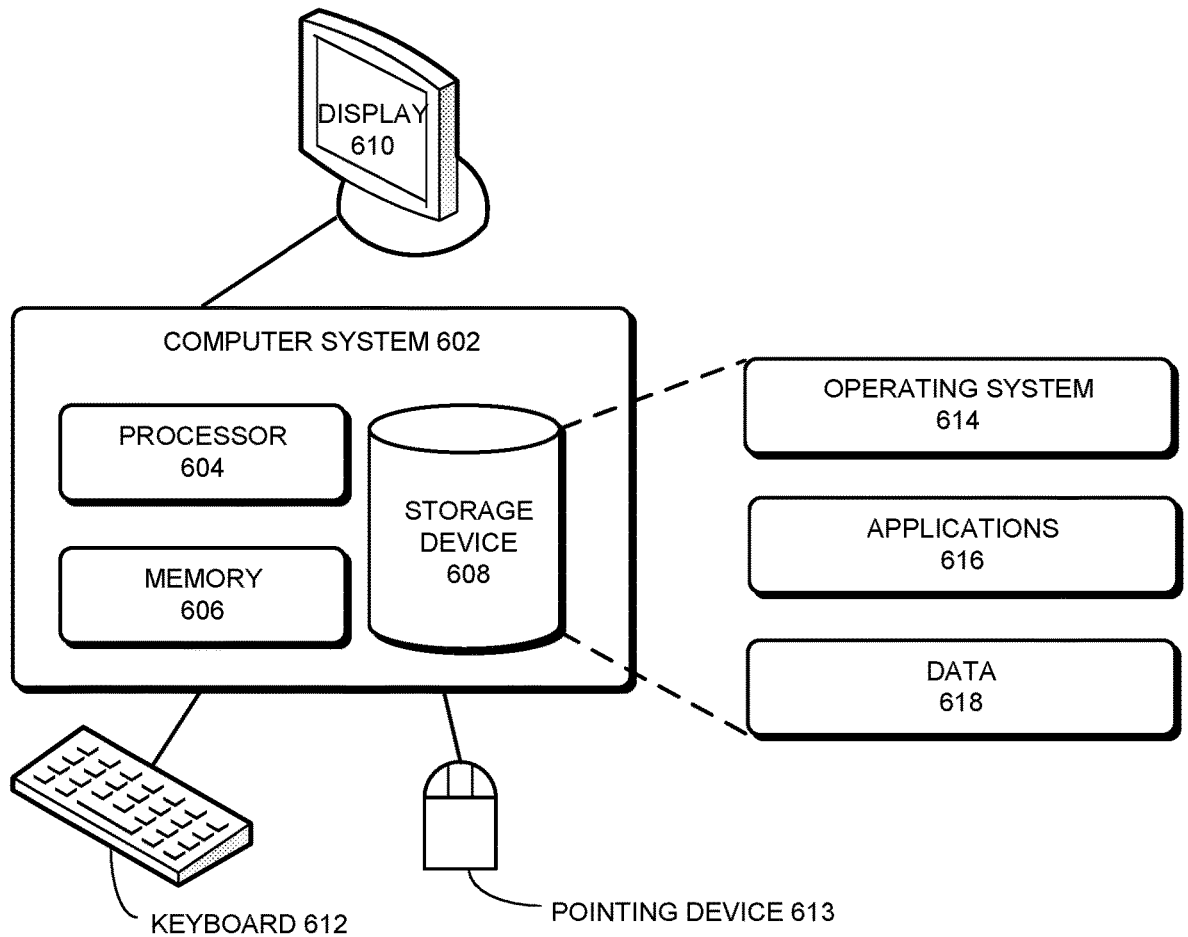
FIG. 6 illustrates a computer system in accordance with some embodiments described herein.

FIG. 6 illustrates a computer system in accordance with some embodiments described herein.

Computer system 602 includes a processor 604, a memory 606, and a storage device 608. Furthermore, computer system 602 can be coupled to a display device 610, a keyboard 612, and a pointing device 613. Storage device 608 can store operating system 614, applications 616, and data 618.

Applications 616 can include instructions which, when executed by computer system 602, can cause computer system 602 to perform methods and/or processes described in this disclosure. Data 618 can include any data that is required as input or that is generated as output by the methods and/or processes described in this disclosure.

Figure 7:
FIG. 7 illustrates an apparatus in accordance with some embodiments described herein.

FIG. 7 illustrates an apparatus in accordance with some embodiments described herein.

Apparatus 702 can comprise a plurality of mechanisms which may communicate with one another via a wired or wireless communication channel. Apparatus 702 may be realized using one or more integrated circuits, and apparatus 702 may include fewer or more mechanisms than those shown in FIG. 7. Further, apparatus 702 may be integrated in a computer system, or it may be realized as a separate device which is capable of communicating with other computer systems and/or devices.

Specifically, apparatus 702 can include receiving mechanism 704, determination mechanism 706, and test generation mechanism 708. Receiving mechanism 704 can be configured to receive a layout for an IC design, or perform any other tasks related to these tasks as disclosed in this disclosure. Determination mechanism 706 can be configured to determine a set of likelihoods of occurrence for a set of faults based at least on a portion of the layout associated with each fault in the set of faults, or perform any other tasks related to these tasks as disclosed in this disclosure. Test generation mechanism 708 can be configured to generate a set of test patterns to target the set of faults based at least on the set of likelihoods of occurrence associated with the set of faults, or perform any other tasks related to these tasks as disclosed in this disclosure.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for assigning faults to nets in an integrated circuit (IC), wherein each net comprises a drive pin, a set of load pins, and a fan-out structure that electrically couples the drive pin to the set of load pins, the method comprising:
   partitioning a fan-out structure of a net into a set of non-overlapping subnets and a set of branch nodes, wherein each branch node electrically couples three or more non-overlapping subnets;
   representing each branch node by using a subnet primitive, wherein each subnet primitive comprises three or more pins that are electrically coupled to non-overlapping subnets that are electrically coupled by the branch node; and
   assigning a fault to a pin of a subnet primitive that is electrically coupled to a non-overlapping subnet, thereby modeling the fault in the non-overlapping subnet.

2. The method of claim 1, wherein each non-overlapping subnet is attached to no more than one drive pin or load pin.

3. The method of claim 1, wherein prior to assigning the fault to the pin of the subnet primitive that is electrically coupled to the non-overlapping subnet, the method further comprises assigning weights to the set of non-overlapping subnets.

4. The method of claim 3, wherein the weights are assigned to the set of non-overlapping subnets based on routing areas of the set of non-overlapping subnets.

5. The method of claim 1, further comprising generating a set of test patterns to test the IC based on the assignment of the fault to the pin of the subnet primitive.

6. A non-transitory computer-readable storage medium storing instructions that, when executed by a computer, cause the computer to perform a method for assigning faults to nets in an integrated circuit (IC), wherein each net comprises a drive pin, a set of load pins, and a fan-out structure that electrically couples the drive pin to the set of load pins, the method comprising:
   partitioning a fan-out structure of a net into a set of non-overlapping subnets and a set of branch nodes, wherein each branch node electrically couples three or more non-overlapping subnets;
   representing each branch node by using a subnet primitive, wherein each subnet primitive comprises three or more pins that are electrically coupled to non-overlapping subnets that are electrically coupled by the branch node; and
   assigning a fault to a pin of a subnet primitive that is electrically coupled to a non-overlapping subnet, thereby modeling the fault in the non-overlapping subnet.

7. The non-transitory computer-readable storage medium of claim 6, wherein each non-overlapping subnet is attached to no more than one drive pin or load pin.

8. The non-transitory computer-readable storage medium of claim 6, wherein prior to assigning the fault to the pin of the subnet primitive that is electrically coupled to the non-overlapping subnet, the method further comprises assigning weights to the set of non-overlapping subnets.

9. The non-transitory computer-readable storage medium of claim 8, wherein the weights are assigned to the set of non-overlapping subnets based on routing areas of the set of non-overlapping subnets.

10. The non-transitory computer-readable storage medium of claim 6, wherein the method further comprises generating a set of test patterns to test the IC based on the assignment of the fault to the pin of the subnet primitive.

11. An apparatus, comprising:
   a processor; and
   a non-transitory computer-readable storage medium storing instructions that, when executed by the processor, cause the apparatus to perform a method for assigning faults to nets in an integrated circuit (IC), wherein each net comprises a drive pin, a set of load pins, and a fan-out structure that electrically couples the drive pin to the set of load pins, and wherein the method comprises:

partitioning a fan-out structure of a net into a set of non-overlapping subnets and a set of branch nodes, wherein each branch node electrically couples three or more non-overlapping subnets;

representing each branch node by using a subnet primitive, wherein each subnet primitive comprises three or more pins that are electrically coupled to non-overlapping subnets that are electrically coupled by the branch node; and assigning a fault to a pin of a subnet primitive that is electrically coupled to a non-overlapping subnet, thereby modeling the fault in the non-overlapping subnet.

12. The apparatus of claim 11, wherein each non-overlapping subnet is attached to no more than one drive pin or load pin.

13. The apparatus of claim 11, wherein prior to assigning the fault to the pin of the subnet primitive that is electrically coupled to the non-overlapping subnet, the method further comprises assigning weights to the set of non-overlapping subnets.

14. The apparatus of claim 13, wherein the weights are assigned to the set of non-overlapping subnets based on routing areas of the set of non-overlapping subnets.

15. The apparatus of claim 11, wherein the method further comprises generating a set of test patterns to test the IC based on the assignment of the fault to the pin of the subnet primitive.

* * * * *